(12) United States Patent
Ivanov (10) Patent No.: US 7,636,234 B2
(45) Date of Patent: Dec. 22, 2009

(54) APPARATUS CONFIGURATIONS FOR AFFECTING MOVEMENT OF FLUIDS WITHIN A MICROELECTRIC TOPOGRAPHY PROCESSING CHAMBER

(75) Inventor: Igor C. Ivanov, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 552 days.

(21) Appl. No.: 11/199,657

(22) Filed: Aug. 9, 2005

(65) Prior Publication Data

US 2006/0030157 A1    Feb. 9, 2006

Related U.S. Application Data (60) Provisional application No. 60/599,975, filed on Aug. 9, 2004.

(51) Int. Cl.
```
H05K 7/00      (2006.01)
C23C 14/00     (2006.01)
B05D 3/12      (2006.01)
B65H 1/00      (2006.01)
```
(52) U.S. Cl. ............... 361/679.01; 118/118; 118/319; 118/320; 427/240; 427/481; 414/225.01
(58) Field of Classification Search ............ None
See application file for complete search history.

(56) References Cited

U.S. PATENT DOCUMENTS

| | | | |
|---|---|---|---|
| 5,674,787 | A | 10/1997 | Zhao et al. |
| 5,942,799 | A | 8/1999 | Danek et al. |
| 6,017,437 | A | 1/2000 | Ting et al. |
| 6,248,168 | B1 * | 6/2001 | Takeshita et al. ........ 118/52 |

(Continued)

FOREIGN PATENT DOCUMENTS

FR    2 816 759    5/2002

(Continued)

OTHER PUBLICATIONS

Shacham-Diamand et al., "Electroless Co(Mo,P) films for Cu interconnect application," Microelectronic Engineering, vol. 64, 2002, pp. 315-320.

(Continued)

*Primary Examiner*—Alonzo Chambliss
(74) *Attorney, Agent, or Firm*—Mollie E. Lettang; Daffer McDaniel, LLP (57) ABSTRACT

An apparatus for processing microelectronic topographies, a method of use of such an apparatus, and a method for passivating hardware of microelectronic processing chambers are provided. The apparatus includes a substrate holder configured to support a microelectronic topography and a rotatable case with sidewalls arranged on opposing sides of the substrate holder. The method of using such an apparatus includes positioning a microelectronic topography upon a substrate holder of a processing chamber, exposing the microelectronic topography to a fluid within the processing chamber, and rotating a case of the processing chamber. The rotation is sufficient to affect movement of the fluid relative to the surface of the microelectronic topography. A method for passivating hardware of a microelectronic processing chamber includes exposing the hardware to an organic compound and subsequently exposing the hardware to an agent configured to form polar bonds with the organic compound.

20 Claims, 2 Drawing Sheets

U.S. PATENT DOCUMENTS

| | | | |
|---|---|---|---|
| 6,286,525 | B1 | 9/2001 | Nishimura et al. |
| 6,290,865 | B1 * | 9/2001 | Lloyd et al. .................... 216/92 |
| 6,326,287 | B1 | 12/2001 | Asahina et al. |
| 6,447,933 | B1 | 9/2002 | Wang et al. |
| 6,645,567 | B2 | 11/2003 | Chebiam et al. |
| 6,824,612 | B2 | 11/2004 | Stevens et al. |
| 6,860,944 | B2 | 3/2005 | Ivanov et al. |
| 6,913,651 | B2 | 7/2005 | Ivanov et al. |
| 7,387,131 | B2 * | 6/2008 | Kuroda et al. ............... 134/149 |
| 2001/0018266 | A1 | 8/2001 | Jiang et al. |
| 2003/0075808 | A1 | 4/2003 | Inoue et al. |
| 2003/0181040 | A1 | 9/2003 | Ivanov et al. |
| 2004/0038073 | A1 | 2/2004 | Chebiam et al. |
| 2004/0097071 | A1 | 5/2004 | Ivanov |
| 2004/0121596 | A1 | 6/2004 | Pan et al. |
| 2004/0216841 | A1 | 11/2004 | Ito et al. |
| 2004/0226654 | A1 * | 11/2004 | Hongo et al. .......... 156/345.11 |
| 2004/0238960 | A1 | 12/2004 | Sukharev et al. |
| 2004/0248409 | A1 | 12/2004 | Padhi et al. |
| 2005/0003654 | A1 | 1/2005 | Horikoshi et al. |
| 2005/0029662 | A1 | 2/2005 | Nakano et al. |
| 2005/0161338 | A1 | 7/2005 | Fang et al. |
| 2005/0181226 | A1 | 8/2005 | Weidman et al. |
| 2006/0029727 | A1 | 2/2006 | Ivanov |
| 2006/0029833 | A1 | 2/2006 | Ivanov |
| 2006/0030143 | A1 | 2/2006 | Ivanov |

FOREIGN PATENT DOCUMENTS

| | | |
|---|---|---|
| JP | 2001020091 A * | 1/2001 |
| WO | 02/092877 | 11/2002 |

OTHER PUBLICATIONS

International Search Report, PCT/US2005/028120, mailed Dec. 9. 2005.
Hu et al., "Reduced electromigration of Cu wires by surface coating," Applied Physics Letters, vol. 81, No. 10, Sep. 2002, pp. 1782-1784.
Patent Abstract of Japan, Publication No. 2004134667, published Apr. 30, 2004.
International Search Report, PCT/U52005/028119, mailed Apr. 21, 2006.
Hu et al., "Reduced Cu interface diffusion of CoWP surface coating," Microelectronic Engineering, vol. 70, 2003, pp. 406-411.
Office Action mailed May 28, 2008 for U.S. Appl. No. 11/199,620.

* cited by examiner

APPARATUS CONFIGURATIONS FOR AFFECTING MOVEMENT OF FLUIDS WITHIN A MICROELECTRIC TOPOGRAPHY PROCESSING CHAMBER

PRIORITY APPLICATION

The present application claims priority to provisional application No. 60/599,975 entitled "Methods and Systems for Processing a Microelectronic Topography" filed Aug. 9, 2004.

BACKGROUND OF THE INVENTION

1. Field of the Invention

This invention generally relates to methods and configurations pertaining to microelectronic topography processing chambers and, more particularly, to methods and apparatus configurations for affecting movement of fluids within a microelectronic topography processing chamber and further to a method for passivating hardware within a microelectronic topography processing chamber.

2. Description of the Related Art

The following descriptions and examples are not admitted to be prior art by virtue of their inclusion within this section.

It is generally advantageous to avoid contamination of microelectronic devices during processing and, as such, many processes are performed within chambers shielded from sources of particles, humidity, and oxidizing atmospheres. In some cases, however, processes performed upon microelectronic topographies and/or the chamber itself may be a source of contamination. For example, deposition processes may be apt to deposit films upon components of a chamber as well as the microelectronic topography intended for the film deposition. In some cases, the adherence of a film to the components of the chamber may be weak and, therefore, the film may be susceptible to breaking off during the deposition process or during subsequent deposition processes, either of which may lead to contamination of a microelectronic topography. In addition or alternatively, a build-up of films on interior surfaces of a chamber may be susceptible to flaking and, thus, may undesirably contaminate more and more microelectronic topographies over time. Film deposition upon chamber components may be particularly incidental in electroless plating processes. In particular, pretreatment processes used for activating a surface to be plated by electroless deposition techniques may also activate hardware within the plating chamber and, consequently, the hardware may be plated with a film.

Another common problem with wet chemistry deposition processes, such as electroless plating or electroplating, for example, is propensity to form a film of non-uniform thickness. In particular, a wet chemistry deposition process may be susceptible to the formation of gas bubbles on the surface of the topography, which may be due in part to the evolution of hydrogen during the reduction-oxidation of the process and/or by a high level of hydrophobicity within the substrate of the wafer. The gas bubbles prevent a material from being deposited uniformly upon a substrate surface, potentially depositing a layer outside the thickness variation specifications of the process. In some embodiments, non-uniformity of thickness within a film deposited from wet chemistry deposition techniques may be additionally or alternatively caused by a lack of uniformity of deposition solution distribution across a microelectronic topography. For example, in embodiments in which a dispense arm or a shower head is used to dispense a deposition solution upon a microelectronic topography, more of the solution may lie in the region of dispensement than in other areas of the topography. In some cases, the lack of solution distribution from the dispense arm or showerhead is resolved by rotating the microelectronic topography during the deposition process. Rotation of the topography, however, requires continuous delivery of the process solution, increasing solution consumption and, in turn, increasing manufacturing costs and environmental detriments.

It would, therefore, be desirable to develop chamber configurations and methods for uniformly distributing a deposition solution across a microelectronic topography without considerably increasing the consumption of solution during processing. In addition, it would be beneficial for such configurations and methods to inhibit the formation of bubbles on surfaces of microelectronic topographies. Furthermore, it would be advantageous to develop a method for passivating hardware of a microelectronic process chamber such that films may be prevented from being deposited thereon.

SUMMARY OF THE INVENTION

The problems outlined above may be in large part addressed by an improved apparatus for processing microelectronic topographies and a method of use of such an apparatus. In addition, a method for passivating hardware of microelectronic processing chambers addresses some of the aforementioned problems. The following are mere exemplary embodiments of the methods and apparatus and are not to be construed in any way to limit the subject matter of the claims.

An embodiment of the apparatus includes a substrate holder configured to support a microelectronic topography and a rotatable case with sidewalls arranged on opposing sides of the substrate holder.

An embodiment of one of the methods includes positioning the microelectronic topography upon a substrate holder of a processing chamber and exposing the microelectronic topography to a fluid within the processing chamber. The method further includes rotating a case of the processing chamber, which is disposed along opposing sides of the substrate holder. The rotation is sufficient to affect movement of the fluid relative to the surface of the microelectronic topography.

Another embodiment of the methods includes exposing hardware of a microelectronic processing chamber to an organic compound and subsequently exposing the hardware to an agent configured to form polar bonds with the organic compound.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1A:
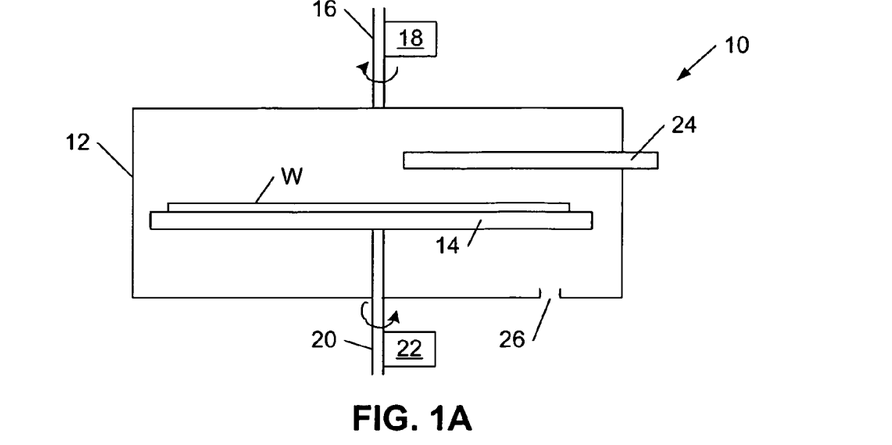
FIG. 1a depicts a partial cross-sectional view of a microelectronic processing chamber during which the chamber and a substrate holder arranged therein are rotated in the same direction.
Figure 1B:
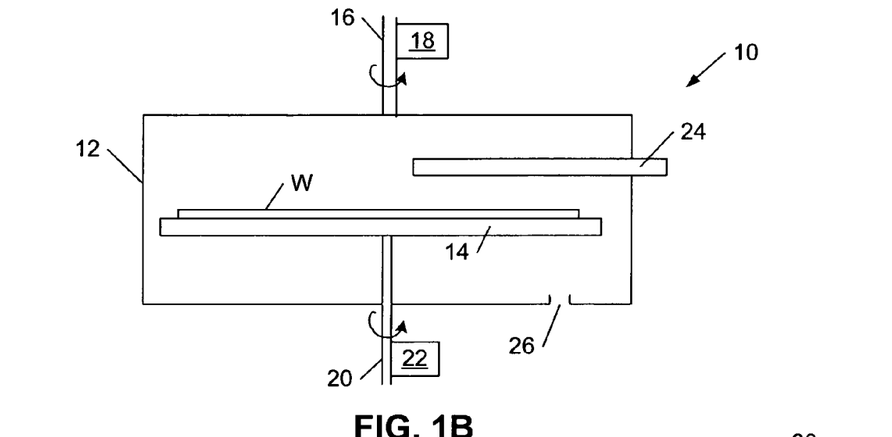
FIG. 1b depicts a partial cross-sectional view of the microelectronic processing chamber depicted in FIG. 1a during which the chamber and the substrate holder are rotated in opposite directions.
Figure 2:
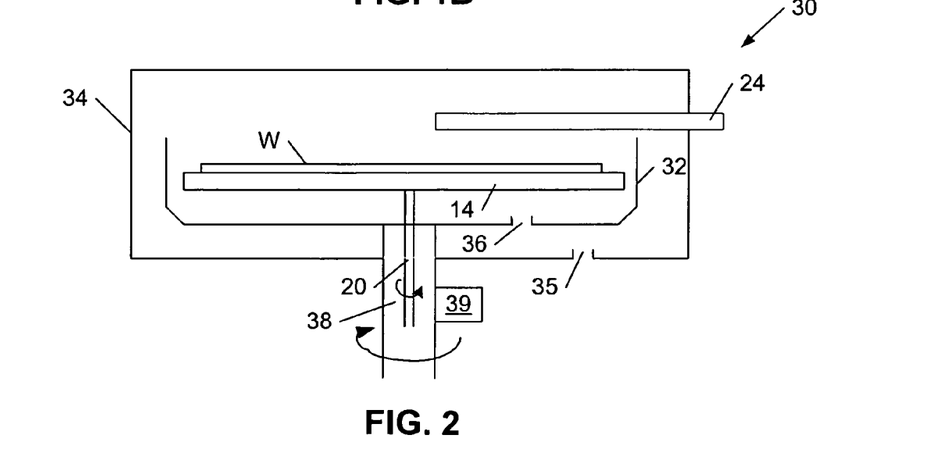
FIG. 2 depicts a partial cross-sectional view of an alternative microelectronic processing chamber in which the chamber and a substrate holder arranged therein are configured to rotate.
Figure 3:
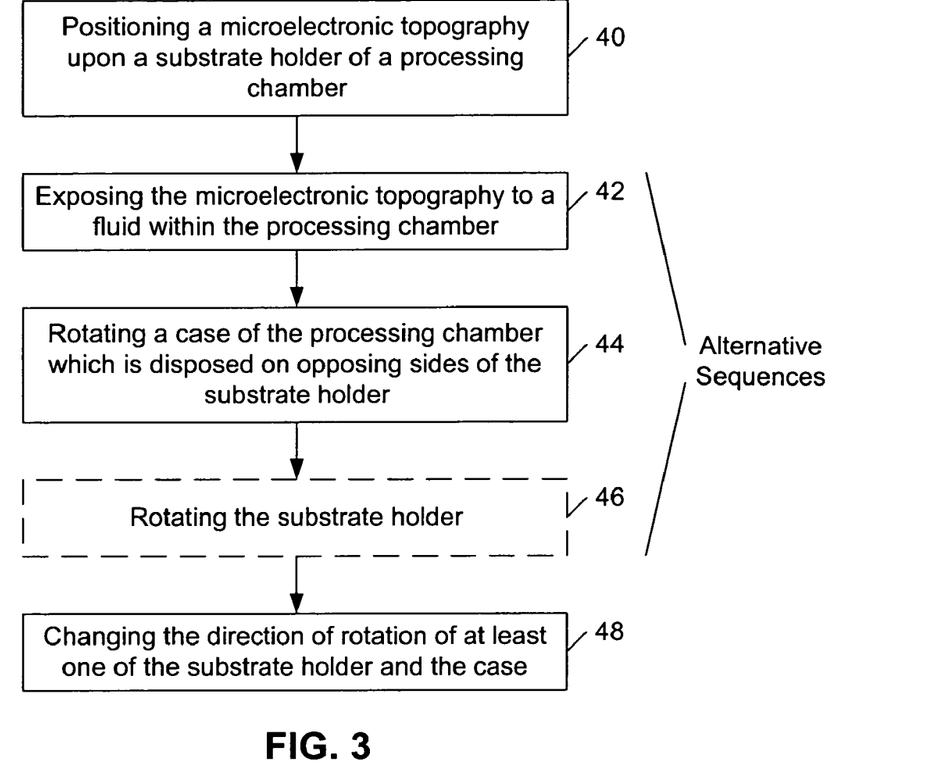
FIG. 3 depicts a flowchart of an exemplary method for processing a microelectronic topography using the microelectronic processing chambers illustrated in FIGS. 1a-2.
Figure 4:
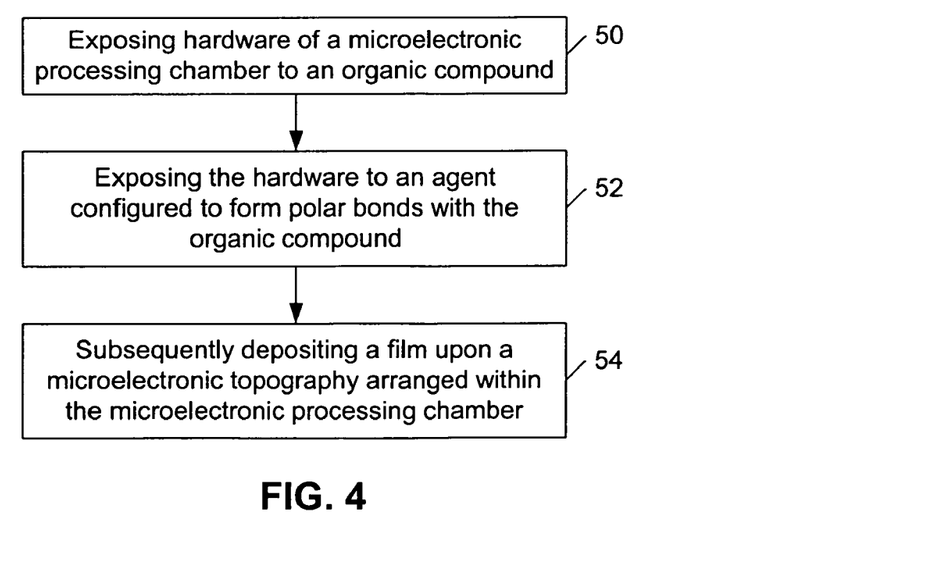
FIG. 4 depicts a flowchart of an exemplary method for passivating hardware within a microelectronic processing chamber.

Turning to the drawings, exemplary configurations of microelectronic processing chambers having a rotatable case are illustrated in FIGS. 1a-2. In addition, a flowchart of an exemplary method for processing a microelectronic topography using such chamber configurations is illustrated in FIG. 3. Furthermore, a flowchart of a method for passivating hardware of a microelectronic processing chamber is shown in FIG. 4. Turning to FIG. 1a, microelectronic processing chamber 10 is shown including substrate holder 14 disposed within rotatable casing 12. More specifically, microelectronic processing chamber 10 is shown with rotatable casing 12 having sidewalls disposed along opposing sides of substrate holder 14 and further having upper and lower walls respectively disposed above and below substrate holder 14, such that substrate holder 14 is enclosed within casing 12. In some embodiments, rotatable casing 12 may be the outermost case of microelectronic processing chamber 10. In other embodiments, however, rotatable casing 12 may be a container interior to the chamber apparatus. It is noted that rotatable casing 12 may not necessarily be an enclosed structure. Rather, microelectronic processing chamber 10 may alternatively include an open-faced cup structure which is configured to rotate about substrate holder 14, such as shown and described below in reference to FIG. 2.

As shown in FIG. 1a, substrate holder 14 may be configured to support microelectronic topography W. Microelectronic topography W is not a component of microelectronic processing chamber 10, but is shown in FIG. 1a to illustrate the placement of a topography within the chamber for processing. In general, the term "microelectronic topography" may refer to a substrate resulting from or used for the fabrication of a microelectronic device or circuit, such as an integrated circuit, for example. In general, microelectronic processing chamber 10 may be configured to allow loading and unloading of microelectronic topography W in and out of the chamber. For example, casing 12 may include a loading port along its sidewalls with a gate casing configured to seal the port for processing. In addition or alternatively, casing 12 may include a detachable cover.

In any case, microelectronic processing chamber 10 may, in some embodiments, include dispense arm 24 for introducing processing fluids onto microelectronic topography W as shown in FIG. 1a. It is noted that the use of a dispense arm for introducing processing fluids into microelectronic processing chamber 10 is exemplary and the chamber is not necessarily so restricted. In particular, microelectronic processing chamber 10 may additionally or alternatively include other means for introducing processing fluids into the chamber, such as but not limited to showerheads and inlets along the sidewalls of casing 12. In any of such cases, rotatable casing 12 may include one or more of outlets 26 by which to output processing fluids. In some embodiments, microelectronic processing chamber 10 may include a heater, such as a resistive, IR, or microwave heater, attached to casing 12 to provide contact solution heating.

In general, microelectronic processing chamber 10 may be configured to rotate casing 12. In particular, microelectronic processing chamber 10 may include shaft 16 coupled to casing 12 and further include rotation mechanism 18 coupled to shaft 16. More specifically, shaft 16 may be fixedly attached to casing 12 such that upon rotation of shaft 16 by rotation mechanism 18 casing 12 is rotated. In some embodiments, microelectronic processing chamber 10 may be further configured to rotate substrate holder 14. In particular, microelectronic processing chamber 10 may, in some embodiments, include shaft 20 coupled to substrate holder 14 and further include rotation mechanism 22 coupled to shaft 20 as shown in FIG. 1a. In such embodiments, shaft 20 may be sealably moveable within casing 12, such that the rotation of shaft 20 does not affect the rotation of casing 12. In other embodiments, substrate holder 14 may not be configured to rotate and, thus, rotation mechanism 22 may be omitted from microelectronic processing chamber 10.

In general, rotation mechanisms 18 and 22 may include any means by which to rotate shafts 16 and 22, which in turn rotate casing 12 and substrate holder 14, respectively. For instance, rotation mechanisms 18 and 22 may include motors, gear wheels and, in some cases, pulleys by which to rotate shafts 16 and 22. Other components known for inducing rotation of structures may also or alternatively be used as apparent to those skilled in the art. In some embodiments, rotation mechanisms 18 and 22 may be programmed with or programmable for specific speed, direction of rotation, duration, and frequency for particular processes of microelectronic processing chamber 10. In other embodiments, such program instructions adaptations may be a separate feature within microelectronic processing chamber 10, but may be configured to access rotation mechanisms 18 and 22. The speeds at which rotation mechanisms 18 and 22 are configured to rotate casing 12 and substrate holder 14 may be similar or different relative to each other, but may generally be between approximately 0 rpm and approximately 8000 rpm, or more specifically between approximately 40 rpm and approximately 1200 rpm. The duration of rotation may be as short as approximately 0.5 seconds up to continual rotation throughout a process or through several processes. Faster or shorter rotational speeds and/or longer or shorter durations may be employed, depending on the deposition chemistry and the layer to be formed.

In some embodiments, rotation mechanisms 18 and 22 may be used to individually rotate shafts 16 and 18. In other cases, however, a single rotation mechanism may be configured to rotate shafts 16 and 18 and, therefore, one of rotation mechanisms 18 and 22 may be coupled to both of shafts 16 and 18 and the other rotation mechanism may be omitted in some embodiments. In either of such cases, the speed, direction of rotation, and duration of rotation of casing 12 and substrate holder 14 may, in some embodiments, be set independent from each other. In alternative configurations, microelectronic processing chamber 10 may be configured to rotate casing 12 and substrate 14 such that at least one aspect of the rotation of casing 12 is dependent on the rotation of substrate 14 or vice versa. In particular, microelectronic processing chamber 10 may, in some embodiments, be configured to rotate casing 12 in a direction based upon the direction of rotation of substrate holder 14 or vice versa. In addition or alternatively, microelectronic processing chamber 10 may be configured to rotate casing 12 and substrate holder 14 at speeds which are proportional to each other. Furthermore, the initiation and/or termination of rotation of either of casing 12 and substrate holder 14 may be dependent on each other.

In any of such cases, rotation mechanisms 18 and 22 may be configured to rotate each of casing 12 and substrate holder 14 in a single direction or in both counter and clockwise directions. For instance, rotation mechanisms 18 and 22 may, in some embodiments, be configured to rotate casing 12 and substrate holder 14 each in a single fixed direction, either in the same direction or in opposite directions. In other embodiments, one of rotation mechanisms 18 and 22 may be configured to rotate casing 12 or substrate holder 14 in both clockwise and counterclockwise directions while the other of rotation mechanisms 18 and 22 may be configured to rotate casing 12 or substrate holder 14 in a single fixed direction. In yet other cases, each of rotation mechanisms 18 and 22 may be configured to rotate casing 12 and substrate holder 14 in both clockwise and counterclockwise directions.

As such, although shafts 16 and 20 are shown in FIG. 1a as rotating in clockwise and counterclockwise directions, respectively, microelectronic processing chamber 10 is not necessarily so limited. In particular, microelectronic processing chamber 10 may be configured to rotate shaft 16 and casing 12 in a counterclockwise direction as shown in FIG. 1b or, in addition or alternatively, microelectronic processing chamber 10 may be configured to rotate shaft 20 and substrate holder 14 in a clockwise direction. As will be discussed in more detail below in reference to FIG. 3, a method for processing a microelectronic topography may include altering the relative directions of a case and a substrate holder within a processing chamber. To help describe such a method, counter-rotation and co-rotation of casing 12 and substrate 14 are shown in FIGS. 1a and 1b, respectively, and are described in conjunction within FIG. 3.

As noted above, FIG. 2 illustrates an embodiment of a microelectronic processing chamber having an open-faced cup structure which is configured to rotate about a substrate holder. In particular, FIG. 2 illustrates an exemplary cross-sectional view of microelectronic processing chamber 30 with rotatable case 32 having sidewalls arranged along opposing sides of substrate holder 14 as well as underneath substrate holder 14. Rotatable case 32, however, does not include a top portion and, therefore, does not enclose substrate holder 14. In such a configuration, microelectronic processing chamber 30 may include some of the same components as microelectronic processing chamber 10 described above in reference to FIG. 1a. In particular, microelectronic processing chamber 30 may include substrate holder 14, shaft 20, and dispense arm 24. Such components may include similar characteristics as those described for components with the same reference numbers in FIG. 1a. In particular, shaft 20 and substrate holder 14 may be configured to support microelectronic topography W. In addition, dispense arm 24 may be configured to introduce processing fluids into the chamber, although other means for introducing processing fluids may be used.

In some embodiments, microelectronic processing chamber 30 may include distinct rotation mechanisms to rotate case 32 and substrate holder 14, such as described for microelectronic processing chamber 10 in FIG. 1a with rotation mechanisms 18 and 22 respectively configured to rotate casing 12 and substrate holder 14. The inclusion of distinct rotation mechanisms, however, are not shown in FIG. 2 to illustrate an alternative embodiment in which a single rotation mechanism is used to rotate substrate holder 14 and case 32. In particular, microelectronic processing chamber 30 is shown in FIG. 2 as having rotation mechanism 39 coupled to shaft 38, which may in turn be used to rotate case 32. In addition, rotation mechanism 39 may, in some embodiments, be coupled to shaft 20, which may in turn rotate substrate holder 14.

Rotation mechanism 39 may be configured to rotate substrate holder 14 and case 32 either independently or dependently. In addition, rotation mechanism 39 may be configured to rotate substrate holder 14 and case 32 in the same direction and/or opposite directions. Furthermore, rotation mechanism 39 may be configured to rotate either or both of substrate holder 14 and case 32 in a single fixed direction or in both clockwise and counterclockwise directions. In some embodiments, rotation mechanism 39 may be programmed with or programmable for specific speed, direction of rotation, duration, and frequency for particular processes of microelectronic processing chamber 30. In other embodiments, such program instruction adaptations may be a separate feature within microelectronic processing chamber 30, but may be configured to access rotation mechanism 39. As with microelectronic processing chamber 10 in FIGS. 1a and 1b, substrate holder 14 may not be configured to rotate in microelectronic processing chamber 30 in some embodiments and, therefore, rotation mechanism 39 may be used to exclusively rotate case 32 in some cases.

As shown in FIG. 2, microelectronic processing chamber 30 may include casing 34 used to enclose case 32 and substrate holder 14. In some cases, casing 34 may include similar characteristics as casing 12 described above in reference to FIG. 1a for microelectronic processing chamber 10. In particular, casing 34 may be the outermost case of microelectronic processing chamber 30 in some embodiments. In other cases, casing 34 may be a container interior to the chamber apparatus. In either of such cases, casing 34 may include one or more of outlets 35 by which to output processing fluids, just as case 32 may include out or more drains 36 by which to output processing fluids. In addition, casing 34 may include one or more inlets for introducing processing fluids into the chamber. In some embodiments, casing 34 may be fixed and, therefore, may not be configured to rotate. In other embodiments, microelectronic processing chamber 30 may be configured to rotate casing 34. In particular, microelectronic processing chamber 30 may, in some cases, include shaft 16 and rotation mechanism 18 coupled to casing 34. In other embodiments, a shaft may be incorporated within or about shaft 38 and rotation mechanism 39 or a different rotation mechanism may be configured to rotate the shaft. In any case, shafts 20 and 39 may be sealably moveable within casing 34.

A flowchart of an exemplary method for processing a microelectronic topography using a chamber which has a case configured to rotate about a substrate holder, such as described in reference to FIGS. 1a-2, is illustrated in FIG. 3. In particular, FIG. 3 illustrates a method including block 40 in which a microelectronic topography is positioned upon a substrate holder of a processing chamber, such as shown in FIGS. 1a-2 with microelectronic topography W positioned upon substrate holder 14. In addition, the method includes block 42 in which the microelectronic topography is exposed to fluid within the process chamber. The exposure of processing fluid to microelectronic topographies within microelectronic processing chambers 10 and 30 are not shown in FIGS. 1a-2 to simplify the drawings.

The exposure of processing fluid to microelectronic topographies may, in some embodiments, include dispensing the processing fluid upon the microelectronic topography within the chamber, such as from dispense arm 24 as described in reference to FIGS. 1a-2, for example. In some embodiments, the exposure may include continually or periodically dispensing a processing fluid upon the microelectronic topography. In some cases, the dispensed fluid may be continually or periodically drained from the chamber such that a fresh supply of the processing fluid is provided to the topography during processing. In other embodiments, the fluid may be dispensed to a fixed level above the microelectronic topography and the topography may be processed from the definite amount. Alternatively, block 42 may include filling the chamber without the substrate holder therein. In such cases, the substrate holder with the microelectronic topography arranged thereon may be subsequently immersed within the bath of fluid. In yet other embodiments, a combination of dispensing the fluid upon the microelectronic topography and immersing the topography within the fluid may be used for block 42.

In any case, the method may further include block 44 in which a case of the processing chamber disposed on opposing sides of the substrate holder is rotated. Such a process may refer to the descriptions of rotatable casing 12 in FIGS. 1a and 1b or rotatable case 32 in FIG. 2. In particular, block 44 may include rotating the case in either a clockwise or counterclockwise direction. In addition, the rotation of the case may generally be between approximately 0 rpm and approximately 8000 rpm, or more specifically between approximately 40 rpm and approximately 1200 rpm. Furthermore, the rotation of the case may be continual or periodic. In some cases, the speed, duration, and/or frequency of rotation of the case may agitate the fluid to a degree sufficient to inhibit the formation of bubbles upon the surface of the microelectronic topography as well as abolish any bubbles, if any, formed upon the surface prior to rotation.

As noted above, preventing the formation of bubbles upon a surface of a microelectronic topography during a deposition process, particularly during an electroless plating operation, may advantageously aid in forming a film with less thickness variation across a substrate. Exemplary rotational speeds to induce such agitation may generally be between approximately 40 rpm and approximately 1200 rpm, which the duration of may be as short as approximately 5 seconds up to continual rotation throughout the deposition process. In embodiments in which the rotation of the case is stopped during a deposition process, the down time may be minimal, such as between approximately 0.5 seconds and 10 seconds in order to minimize the generation of bubbles. Faster or shorter rotational speeds and longer or shorter durations and frequencies than the ones noted above, however, may be employed, depending on the deposition chemistry and the layer to be formed.

In any case, the method may, in some embodiments, include block 46 in which the substrate holder upon which the microelectronic topography is positioned rotates. In some embodiments, the substrate holder may be rotated at the same time as the case, which as described in more detail below may be advantageous for many reasons. In some cases, the rotations of the substrate holder and case may have the same schedule for initiating and terminating rotation. In other cases, the rotations of the substrate holder and case may be skewed (i.e., for at least a portion of time during processing of the microelectronic topography). In particular, rotations of the substrate holder and the case may have differing initiation and/or termination times in some embodiments. In some cases, the rotation of the substrate holder and the case may alternate such that only one of the two components is rotating at a time. In other cases, the method may include a combination of simultaneous rotations and non-coincidental rotations. In any case, the rates, duration and frequencies of rotations noted above for the case with the processing chamber may be generally applied to the rotation of the substrate holder. The case and the substrate holder may be conducted with substantially similar or different rates, durations, and/or frequencies. In yet other embodiments, block 46 and the rotation of the substrate holder may be omitted from the method described in reference to FIG. 3 and, as such, block 46 is outlined with a dotted line indicating the step is optional.

FIG. 3 notes on the right hand side of the flowchart that alternative sequences may be employed for steps 42, 44, and 46. In particular, the method is not specific to the order in which the processing fluid is exposed to microelectronic topography, the time at which rotation of the case is initiated, or the time at which the rotation of the substrate holder is initiated. As such, the method is not necessarily restricted to the order of blocks illustrated in FIG. 3. In particular, the initiation of the rotation of the case and the substrate holder may be switched in some embodiments as in the exemplary sequence of steps noted below. In addition or alternatively, exposure of the processing fluid to the microelectronic topography may occur subsequent to initiation of one or both of the rotation processes. In yet other embodiments, the method may be performed with any two or all three processes occurring simultaneously.

Regardless of the order in which steps 42, 44, and 46 are performed, the method may include changing the direction of rotation of at least one of the substrate holder and the case as noted in block 48 of the flowchart illustrated in FIG. 3. Such a change in rotation may, in some cases, be conducted during a processing step such as during a depositing, etching, cleaning, or drying process of the microelectronic topography. In other embodiments, the step may be conducted between processes performed upon the microelectronic topography to clear fluid from the surface of the microelectronic topography. As noted below, in some embodiments, the direction of rotation of only one of the substrate holder and the case may be changed in correspondence to block 48 such that the relative direction of rotations between the substrate holder and case is switched (i.e., switched from rotating in the same direction to rotating in opposite directions or vice versa). In other embodiments, both of the substrate holder and the case may be changed, either at the same time or at different times. In some embodiments, the method may continue to change the direction of rotation of the substrate holder and/or the case at a specified frequency for an indefinite or predetermined number of times during processing of the microelectronic topography. In some cases, the speed and duration of rotation for the component having the changed direction of rotation may be similar to the speed and duration schedule specified in relation to block 44. In other embodiments, the speed and rotation of the component may change with the direction of rotation.

As noted above, it may be advantageous to rotate the case and the substrate holder at the same time in some cases. In particular, rotating the case in the opposite direction as the direction of the substrate holder may serve to propel the processing fluid toward the center portion of the microelectronic topography, counteracting the centrifugal force of the rotating substrate holder. More specifically, the high friction forces of the processing fluid flowing towards the rotating case walls by the centrifugal forces of the substrate holder will create local vortexes returning the fluid towards the center of the topography. Such a configuration may be particularly advantageous for electroless plating processes since the deposition of the film is rooted from reaction of the fluid with the topography surface. In some embodiments, the counter-rotation of the case and the substrate may be specifically configured to provide uniform distribution of the deposition solution across the topography and, as a consequence, thickness variation of a resulting film may be reduced. FIGS. 1a and 2 illustrate embodiments in which a case and substrate holder of a microelectronic processing chamber are rotated in opposite directions and, therefore, illustrate examples of the aforementioned counter-rotation configuration. The configuration is not restricted, however, to counter-clockwise rotation of the substrate holder and clockwise rotation of the case as shown in FIGS. 1a and 2. In particular, the case may be alternatively rotated counter-clockwise and the substrate holder may be rotated clockwise.

In contrast to counter-rotation of the case and the substrate holder, the removal of fluid upon the topography may be efficiently performed by embodiments in which the case is rotated in the same direction as the direction of the substrate holder, as depicted in FIG. 1b, for example. In particular, fluid may be removed from the topography surface due to the centrifugal force of the substrate holder. In addition, reapplication of the fluid back to the topography surface may be prevented due to the centrifugal force of the case to hold the removed fluid against the sidewalls of the case. The configuration of co-rotation is not limited to counter-clockwise rotation and, therefore, case 22 and substrate 14 in FIG. 1b may alternatively be rotated clockwise to facilitate the removal of fluid from the topography. Although not illustrated, clockwise or counter-clockwise co-rotation configurations may similarly be applied to microelectronic processing chamber 30 in FIG. 3. It is noted that changing the direction of rotation of at least one of the substrate holder and the case is not necessarily needed for the method described herein and, therefore, block 48 and the associated process may be omitted from the method in some cases.

As noted above, the configurations of the microelectronic processing chambers illustrated in FIGS. 1a-2 and the method presented in FIG. 3 may be particularly applicable to deposition processes, and in some cases, particularly applicable to electroless plating processes. The chamber configurations and method, however, are not necessarily so limited. In particular, the chamber configurations and method may be applied to any type of process used to fabricate a microelectronic topography, including but not limited to etching, cleaning, drying, as well as deposition techniques other than electroless plating. In some embodiments, the chamber configurations and method described in reference to FIGS. 1a-3 may be applied to a combination of different processes. For example, an exemplary sequence of processes may include a deposition process, a rinsing process, and a drying process all within a single processing chamber, and in some cases, utilizing the adaptations of co-rotation and counter-rotation of the case and substrate holder.

An exemplary series of steps used to fulfill such a sequence of process steps using the chamber configurations and method described herein may include loading a microelectronic topography into a substrate holder of a microelectronic processing chamber and rotating the substrate holder. Thereafter, the microelectronic topography may be exposed to a deposition solution and the deposition process may be started while employing counter-rotation of the chamber case and substrate holder to create a counterflow of the solution from the chamber walls towards the center of the topography and, consequently, provide uniform coverage over the topography. Upon commencing the film deposition, the series of steps may continue with changing the rotation direction of the chamber case or substrate holder to facilitate co-rotation and invoke removal of the deposition solution from the topography. In addition, the deposition solution may be drained from the chamber.

Next, the microelectronic topography may be exposed to a rinsing fluid while employing counter-rotation of the substrate holder and the chamber case and subsequently using co-rotation to clear away any remaining deposition solution residue and byproduct debris. Subsequent thereto, a series of steps may be conducted which include draining the rinsing fluid from the chamber, opening the chamber, and drying the wafer via the open chamber. In particular, the process may include first accelerating the chamber case and the substrate holder in same rotational direction and then opening the chamber to allow immediate drying of the wafer surface. In some cases, the process may use a low-surface tension fluid, such as an alcohol solution in water, to dry the topography in addition or alternative to opening the chamber. It is noted that other processes may also be included and/or the order of steps may be altered in the abovementioned sequence of processes and, therefore, the method described herein is not necessarily limited thereto.

As noted above, a method for passivating hardware within a microelectronic processing chamber is outlined in a flowchart shown in FIG. 4. In particular, FIG. 4 illustrates a method including block 50 in which hardware of a microelectronic processing chamber is exposed to an organic compound. The term "organic compound", as used herein, may refer to a compound including at least one carbon atom and at least one hydrogen atom. In general, the organic compound is preferably selected to be inactive with the processing fluids intended to be used within the microelectronic processing chamber. For example, in cases in which the microelectronic processing chamber is an electroless deposition chamber, the organic compound is preferably non-reactive with the deposition solutions to be used in the chamber. An exemplary type of organic compound that may be used to expose hardware of an electroless deposition chamber as well as other types of processing chambers may include but is not limited to carboxylic acids.

The organic compound may serve to pretreat the hardware surfaces such that a polar bond may be formed with a subsequently applied agent as noted in block 52. In some embodiments, the agent may be heated or, more specifically, applied at a temperature between 60° C. and approximately 120° C. and, in some cases, at approximately 80° C. The heated agent offers fast polarizing molecules to passivate the wetted surfaces of the hardware. As a result, active centers of the hardware which may have an affinity to adhering films thereto, such as by electroless deposition processes, may be neutralized, preventing deposition of films thereon. The general chemical equation of the thermal passivation process is R4-N—OH+R—OH=R4-N—O—R, wherein R is an alkyl group, R4-N—OH is the polarizing agent, R—OH is the organic compound, and R4-N—O—R is the layer of passivation on the hardware. An exemplary polarizing agent that has shown to be particularly effect is tetramethylammonium hydroxide (TMAH), but other chemicals known for strong polarizing effect with organic compounds may be used. In general, the thermal passivation process may be conducted for a duration between 0.5 hours and approximately 4.0 hours, although shorter and longer time periods may be employed.

Subsequent to the exposure to the polarizing agent, the method may include a film deposition process within the microelectronic processing chamber as shown in block 54. Due to the thermal passivation technique, the film may be inhibited from forming on the hardware of the chamber. It is noted that the technique described herein and the materials noted above are particularly applicable to passivating plastic hardware components, which are commonly employed with electroless deposition chambers. As such, the method described in reference to FIG. 4 may be particularly applicable for but is not limited to passivating hardware of an electroless deposition chamber.

It will be appreciated to those skilled in the art having the benefit of this disclosure that this invention is believed to provide improved apparatus for processing microelectronic topographies and a method of use of such an apparatus. In addition, a method for passivating hardware of microelectronic processing chambers is provided. Further modifications and alternative embodiments of various aspects of the invention will be apparent to those skilled in the art in view of this description. For example, although the chamber configurations and methods are specifically referenced for applications of electroless plating techniques and chambers, the chambers and methods are not necessarily so limited and may be applied to any type of microelectronic chamber or process. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus for processing a microelectronic topography, comprising:
    a substrate holder configured to support a microelectronic topography;
    a first shaft coupled to the substrate holder;
    a rotatable case comprising sidewalls arranged on opposing sides of the substrate holder;
    a second shaft coupled to the rotatable case; and
    one or more rotation mechanisms coupled to the first and second shafts, wherein the one or more rotation mechanisms are configured to rotate the first and second shafts in opposite directions relative to each other such that the substrate holder and the rotatable case are rotated in opposite directions relative to each other.

2. The apparatus of claim 1, wherein the one or more rotation mechanisms are configured to rotate the first shaft independent of the second shaft such that the substrate holder is rotated independent of the rotatable case.

3. The apparatus of claim 1, wherein the one or more rotation mechanisms are configured to rotate at least one of the first and second shafts in both clockwise and counterclockwise directions such that at least one of the substrate holder and the rotatable case are rotated in both clockwise and counterclockwise directions.

4. The apparatus of claim 1, wherein the rotatable case encloses the substrate holder.

5. The apparatus of claim 1, wherein the sidewalls of the rotatable case comprise outermost sidewalls of the apparatus.

6. The apparatus of claim 1, wherein the one or more rotation mechanisms are programmed or are configured to receive program instructions for governing speeds, directions, and durations of rotations of the first and second shafts relative to particular processes performed in the apparatus such that speeds, directions, and durations of rotations of the rotatable case and the substrate holder are governed relative to particular processes performed in the apparatus.

7. The apparatus of claim 1, wherein the one or more rotation mechanisms are programmed or are configured to receive program instructions for changing a direction of rotation of at least one of the first and second shafts during and/or between processes performed in the apparatus such that a direction of rotation of at least one of the rotatable case and the substrate holder is changed during and/or between processes performed in the apparatus.

8. An apparatus for processing a microelectronic topography, comprising:
    a substrate holder configured to support a microelectronic topography;
    a first shaft coupled to the substrate holder;
    a casing comprising sidewalls arranged on opposing sides of the substrate holder;
    a second shaft coupled to the rotatable case; and
    a rotation mechanism coupled to the second shaft, wherein the rotation mechanism is configured to rotate the second shaft independent of moving the first shaft such that the casing is rotated independent of moving the substrate holder.

9. The apparatus of claim 8, wherein the apparatus is further configured to rotate the first shaft and the substrate holder.

10. The apparatus of claim 9, further comprising a distinct rotation mechanisms coupled to the first shaft for rotating the first shaft and the substrate holder.

11. The apparatus of claim 9, wherein the rotation mechanism is further coupled to the first shaft and is configured to rotate the first and second shafts and respectively the substrate holder and the casing.

12. The apparatus of claim 9, wherein the apparatus is further configured to rotate the first and second shafts in opposite directions relative to each other such that the substrate holder and the casing are rotated in opposite directions relative to each other.

13. The apparatus of claim 9, wherein the apparatus is configured to rotate at least one of the first and second shafts in both clockwise and counterclockwise directions such that at least one of the substrate holder and the casing is rotated in both clockwise and counterclockwise directions.

14. An apparatus for processing a microelectronic topography, comprising:
    a substrate holder configured to support a microelectronic topography;
    a rotatable case, comprising:
        sidewalls arranged on opposing sides of the substrate holder; and
        a lower wall disposed below the substrate holder;
    a shaft coupled to the rotatable case; and
    a rotation mechanism coupled to the shaft, wherein the rotation mechanism is configured to rotate the shaft and the case.

15. The apparatus of claim 14, wherein the rotatable case further comprises an upper wall disposed above the substrate holder.

16. The apparatus of claim 15, wherein the substrate holder is enclosed within the rotatable case.

17. The apparatus of claim 14, wherein the rotatable case is an open-top cup structure.

18. The apparatus of claim 17, further comprising another shaft coupled to the substrate holder, wherein the shafts respectively coupled to the substrate holder and the case are nested.

19. The apparatus of claim 14, further comprising another shaft coupled to the substrate holder, wherein the apparatus is configured to rotate the shaft coupled to the case independent of the shaft coupled to the substrate holder such that the case is rotated independent of moving the substrate holder.

20. The apparatus of claim 14, further comprising another shaft coupled to the substrate holder, wherein the apparatus is configured to rotate the shafts respectively coupled to the substrate holder and the case in opposite directions relative to each other such that the substrate holder and the case are rotated in opposite directions relative to each other.

* * * * *